(12) United States Patent
Ando et al.

(10) Patent No.: US 8,773,421 B2
(45) Date of Patent: Jul. 8, 2014

(54) MULTIPLEXER FOR DIFFERENTIAL SIGNAL

(75) Inventors: Kimio Ando, Kyoto (JP); Yuki Aoki, Kyoto (JP)

(73) Assignee: Rohm Co., Ltd. (JP)

( * ) Notice: Subject to any disclaimer, the term of this patent is extended or adjusted under 35 U.S.C. 154(b) by 704 days.

(21) Appl. No.: 13/032,762

(22) Filed: Feb. 23, 2011

(65) Prior Publication Data
US 2011/0273431 A1    Nov. 10, 2011

(30) Foreign Application Priority Data

Feb. 23, 2010    (JP) .................................. 2010-036898

(51) Int. Cl.
  *G01R 33/12*    (2006.01)
  *G06F 3/00*    (2006.01)
  *G06F 5/00*    (2006.01)
(52) U.S. Cl.
  USPC ............................................ 345/212; 710/51
(58) Field of Classification Search
  None
  See application file for complete search history.

(56) References Cited

U.S. PATENT DOCUMENTS 5,144,174 A * 9/1992 Murakami .................... 327/277

FOREIGN PATENT DOCUMENTS

JP    11-136112 A    5/1999

OTHER PUBLICATIONS

Razavi, Design of Integrated Circuit for Optical Communications, USA, McGraw-Hill, 2003, p. 334.*
Behzad Razavi, Design of Integrated Circuit for Optical Communications, USA, McGraw-Hill, 2003, p. 334.

* cited by examiner

*Primary Examiner* — Alexander S Beck
*Assistant Examiner* — Kirk Hermann
(74) *Attorney, Agent, or Firm* — Cantor Colburn LLP (57) ABSTRACT

A multiplexer receives multiple differential signals, selects one differential signal, and outputs, via an output port, the differential signal thus selected. The multiple differential signals are respectively input to multiple differential input ports. Multiple buffers are respectively provided to the multiple differential input ports. Each buffer includes a differential input terminal connected to a corresponding differential input port, and a differential output terminal connected to an output port. Each buffer is configured to be capable of switching states, according to the control signal, between an enable state in which a differential signal that corresponds to a differential signal input to the differential input terminal is output, and a disable state in which current consumed by the buffer becomes substantially zero, and the differential output terminal thereof is set to a high-impedance state.

11 Claims, 7 Drawing Sheets

BUF

| 01 | 02 | A | B | Y | Z | OUT |
|----|----|---|---|---|---|-----|
| L | L | x | x | H | L | Z |
| H | L | L | x | H | H | L |
| H | L | H | x | L | L | H |
| L | H | x | L | H | H | L |
| L | H | x | H | L | L | H |
| H | H | x | x | x | x | x |

MULTIPLEXER FOR DIFFERENTIAL SIGNAL

BACKGROUND OF THE INVENTION

1. Field of the Invention

The present invention relates to a multiplexer and a parallel/serial converter for differential signals.

2. Description of the Related Art

In recent years, in order to transmit a video signal or an audio signal between multiple electronic devices, high-speed differential interfaces such as HDMI (High-Definition Multimedia Interface) or DVI (Digital Visual Interface) are employed. For example, a TV includes multiple HDMI input ports, selects one of the signals input to these HDMI input ports, and displays the signal thus selected on a display panel. In order to select one differential signal from among multiple differential signals, a multiplexer (multiple input, single output selector) is employed.

Figure 1A:
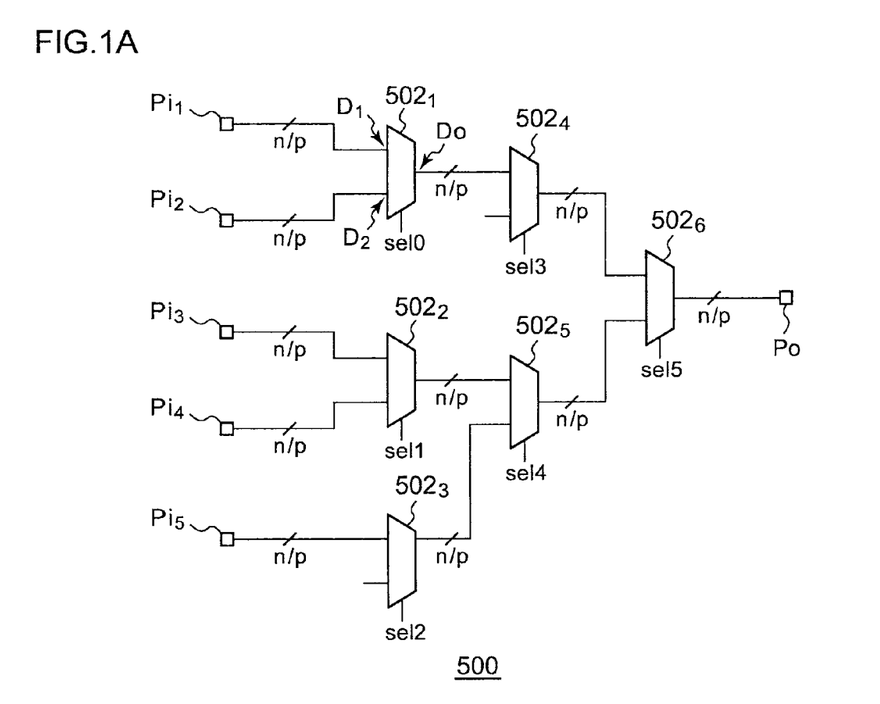
FIGS. 1A and 1B are circuit diagrams each showing an example configuration of a multiplexer having five input ports and one output port.
Figure 1B:
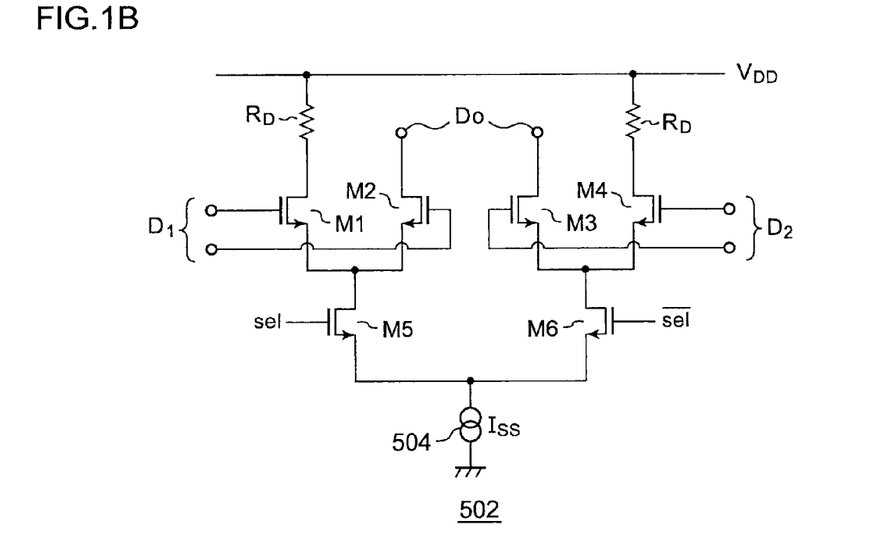

FIGS. 1A and 1B are circuit diagrams each showing an example configuration of a five input, one output multiplexer. A multiplexer 500 includes five input ports $Pi_1$ through $Pi_5$, a single output port Po, and two input, one output selectors (switches) $502_1$ through $502_6$ connected in tournament form. The selectors $502_1$ through $502_6$ each include two differential input terminals $D_1$ and $D_2$, and a single differential output terminal Do. When a corresponding control signal sel is high level, each selector 502 selects a differential signal input to the first input terminal $D_1$. When the corresponding control signal sel is low level, the selector 502 selects a differential signal input to the second input terminal $D_2$. Each selector 502 outputs the signal thus selected via the output terminal Do.

One of the signals input to the input ports $Pi_1$ through $Pi_5$ is output via the output port Po according to the combination of the values of the control signals sel0 through sel5. The selectors $502_3$ and $502_4$ do not perform any substantial selection operation, but are each arranged to make the propagation delay amounts uniform over all the paths.

RELATED ART DOCUMENTS

Patent Documents

[Patent Document 1]
Japanese Patent Application Laid Open No. H11-136112
[Non-Patent Document]
[Non-Patent Document 2]
Behzad Razavi, "Design of Integrated Circuit for Optical Communications," McGraw-Hill, USA (2003), p. 334.

FIG. 1B is a circuit diagram showing an example configuration of the selector 502 (Non-patent document 1). The selector 502 includes transistors M1 through M6, a current source 504, and two load resistors $R_D$. With such a configuration, a constant current Iss generated by the current source 504 ordinarily flows through the selector 502. Accordingly, the overall consumption of current by the multiplexer 500 shown in FIG. 1A increases in proportion to the number of selectors 502.

Furthermore, in a case in which the selectors 502 are arranged in tournament form as shown in FIG. 1A, the number of stages of the selectors 502 increases as the number of input ports increases. This increases the circuit scale, as well as increasing the propagation delay applied to each signal.

SUMMARY OF THE INVENTION

The present invention has been made in order to solve such a problem. Accordingly, it is an exemplary purpose of the present invention to provide a multiplexer having reduced power consumption.

1. An embodiment of the present invention relates to a multiplexer configured to receive multiple differential signals, to select one that corresponds to a control signal, and to output, via an output port, the differential signal thus selected. The multiplexer comprises: multiple differential input ports each configured to receive a corresponding signal from among the multiple differential signals; and multiple buffers respectively provided to the multiple differential input ports. The multiple buffers each comprise a differential input terminal connected to the corresponding differential input port and a differential output terminal connected to the output port. Furthermore, each buffer is configured such that the states thereof are switchable according to the control signal between an enable state in which a differential signal that corresponds to the differential signal input to the differential input terminal is output, and a disable state in which current consumed by the buffer becomes substantially zero and the differential output terminal thereof is set to a high-impedance state.

With such an embodiment, current flows through only the buffer through which the selected differential signal passes and the current consumed in the other buffers becomes substantially zero, thereby reducing the overall current consumption in the multiplexer. Furthermore, the number of buffers is proportional to the number of differential signals. Thus, such an arrangement provides a reduced circuit area in comparison with an arrangement in which the buffers are arranged in a tournament. Furthermore, such an arrangement has an advantage in that the propagation delay applied to each differential signal does not depend on the number of differential signals.

Also, each of the multiple buffers may comprise: a differential input terminal; a differential output terminal; a first fixed voltage terminal; a second fixed voltage terminal; a first transistor and a second transistor each configured as a P-channel MOSFET (Metal Oxide Semiconductor Field Effect Transistor) and a third transistor and a fourth transistor each configured as an N-channel MOSFET, which are arranged in series between the first fixed voltage terminal and the second fixed voltage terminal; and a fifth transistor configured as a P-channel MOSFET and a sixth transistor configured as an N-channel MOSFET, which are sequentially arranged in series so as to form a path in parallel with a path comprising the second and third transistors. Also, the gates of the second and third transistors may be connected to one side of the differential input terminal. Also, the gates of the fifth and sixth transistors may be connected to the other side of the differential input terminal. Also, the drains of the second and third transistors may be connected to one side of the differential output terminal. Also, the drains of the fifth and sixth transistors may be connected to the other side of the differential output terminal. Also, an inversion signal that is the inversion of the control signal may be input to the gate of the first transistor. Also, the control signal may be input to the gate of the fourth transistor.

Another embodiment of the present invention relates to a signal processing circuit configured to receive multiple image data in the form of differential signals, to select one image data from among the multiple image data, and to output the image data thus selected. The signal processing circuit comprises: a multiplexer according to any one of the aforementioned embodiments, configured to receive the multiple image data, and to select one from among the image data thus received; a serial/parallel converter configured to perform serial/parallel conversion of the image data output from the multiplexer; a signal processing unit configured to perform predetermined signal processing on an output signal of the serial/parallel converter; a differential conversion unit configured to convert the signal processed by the signal processing unit into a differential signal; a parallel/serial converter configured to perform parallel/serial conversion of the differential signal output from the differential conversion unit; and a transmission unit configured to transmit an output signal of the parallel/serial converter.

Yet another embodiment of the present invention relates to a display apparatus. The display apparatus comprises the aforementioned signal processing circuit.

2. Yet another embodiment of the present invention relates to a parallel/serial converter configured to convert parallel data into serial data. The parallel/serial converter comprises: multiple two-to-one selectors respectively provided to two-bit pairs of the parallel data; and an output buffer configured to receive output signals of the multiple two-to-one selectors. Each of the two-to-one selectors comprises: a first input terminal configured to receive one bit of the corresponding two-bit pair; a second input terminal configured to receive the other bit of the corresponding two-bit pair; and a control terminal configured to receive, as an input signal, a two-bit control signal. When a first bit of the control signal is asserted, a signal that corresponds to the signal input to the first input terminal is output. When a second bit of the control signal is asserted, a signal that corresponds to the signal input to the second input terminal is output. When the first bit and the second bit of the control signal are negated, the output thereof is set to a high-impedance state.

By providing a two-to-one selector for each two-bit pair of the parallel data, such an arrangement reduces the parasitic capacitance that occurs at the input terminal of the buffer to approximately half that of an arrangement in which a switch is provided for each bit of the parallel data. Thus, such an arrangement provides high-speed signal transmission.

Also, the two-to-one selector may comprise: a first AND gate configured to generate the logical AND of the signal input to the first input terminal and the first bit of the control signal; a second AND gate configured to generate the logical AND of a signal input to the second input terminal and the second bit of the control signal; a third AND gate configured to generate the logical AND of an inversion signal that is the inversion of the signal input to the first input terminal and the first bit of the control signal; a fourth AND gate configured to generate the logical AND of an inversion signal that is the inversion of the signal input to the second input terminal and the second bit of the control signal; a high-side transistor configured as a P-channel MOSFET and a low-side transistor configured as an N-channel MOSFET, which are sequentially arranged in series between a first fixed voltage terminal and a second fixed voltage terminal; a first NOR gate configured to generate the logical NOR of an output signal of the first AND gate and an output signal of the second AND gate, and to output the logical NOR thus generated to the gate of the high-side transistor; and a first OR gate configured to generate the logical OR of an output signal of the third AND gate and an output signal of the fourth AND gate, and to output the logical OR thus generated to the gate of the low-side transistor.

Also, the two-to-one selector may comprise: a first NAND gate configured to generate the logical NAND of a signal input to the first input terminal and the first bit of the control signal; a second NAND gate configured to generate the logical NAND of a signal input to the second input terminal and the second bit of the control signal; a third NAND gate configured to generate the logical NAND of an inversion signal that is the inversion of the signal input to the first input terminal and the first bit of the control signal; a fourth NAND gate configured to generate the logical NAND of an inversion signal that is the inversion of the signal input to the second input terminal and the second bit of the control signal; a high-side transistor configured as a P-channel MOSFET and a low-side transistor configured as an N-channel MOSFET, which are sequentially arranged in series between a first fixed voltage terminal and a second fixed voltage terminal; a fifth AND gate configured to generate the logical AND of an output signal of the first NAND gate and an output signal of the second NAND gate, and to output the logical AND thus generated to the gate of the high-side transistor; and a fifth NAND gate configured to generate the logical NAND of an output signal of the third NAND gate and an output signal of the fourth NAND gate, and to output the logical NAND thus generated to the gate of the low-side transistor.

Yet another embodiment of the present invention relates to a signal processing circuit configured to receive multiple image data in the form of differential signals, to select one from among the multiple image data, and to output the image data thus selected. The signal processing circuit comprises: a multiplexer configured to receive the multiple image data, and to select one image data; a serial/parallel converter configured to perform serial/parallel conversion on the image data output from the multiplexer; a signal processing unit configured to perform predetermined signal processing on an output signal of the serial/parallel converter; a differential conversion unit configured to convert the signal processed by the signal processing unit into a differential signal; a parallel/serial converter according to any one of the aforementioned embodiments, configured to perform parallel/serial conversion of the differential signal output from the differential conversion unit; and a transmission unit configured to transmit an output signal of the parallel/serial converter.

Yet another embodiment of the present invention relates to a display apparatus. The display apparatus comprises the aforementioned signal processing circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 2A:
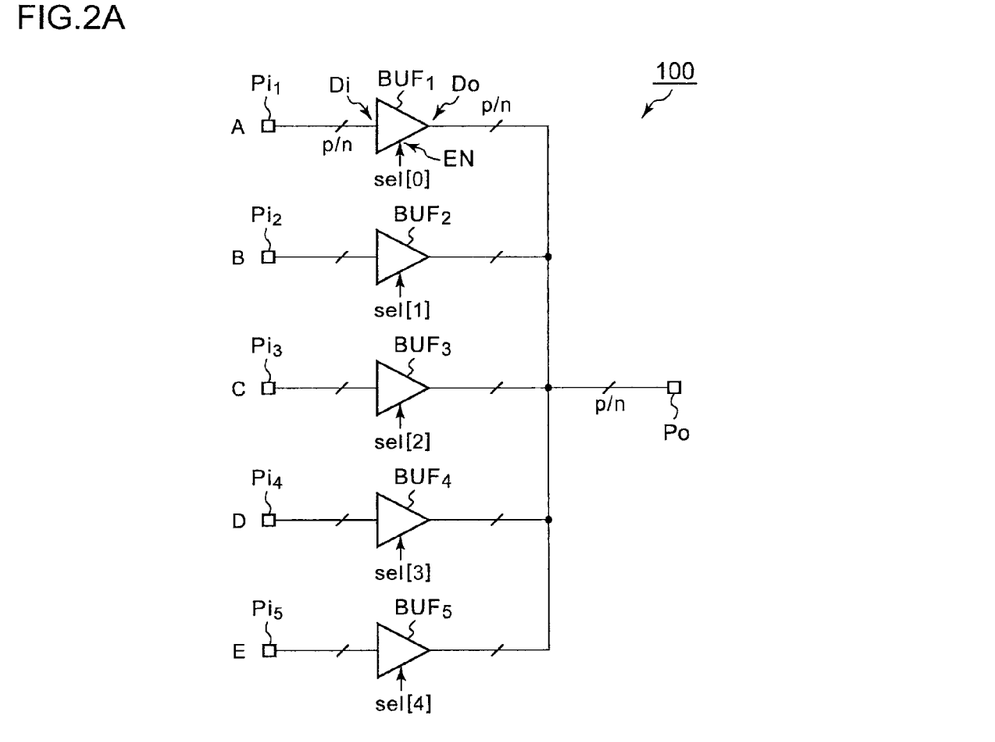
FIGS. 2A and 2B are circuit diagrams each showing a configuration of a multiplexer according to a first embodiment.
Figure 2B:
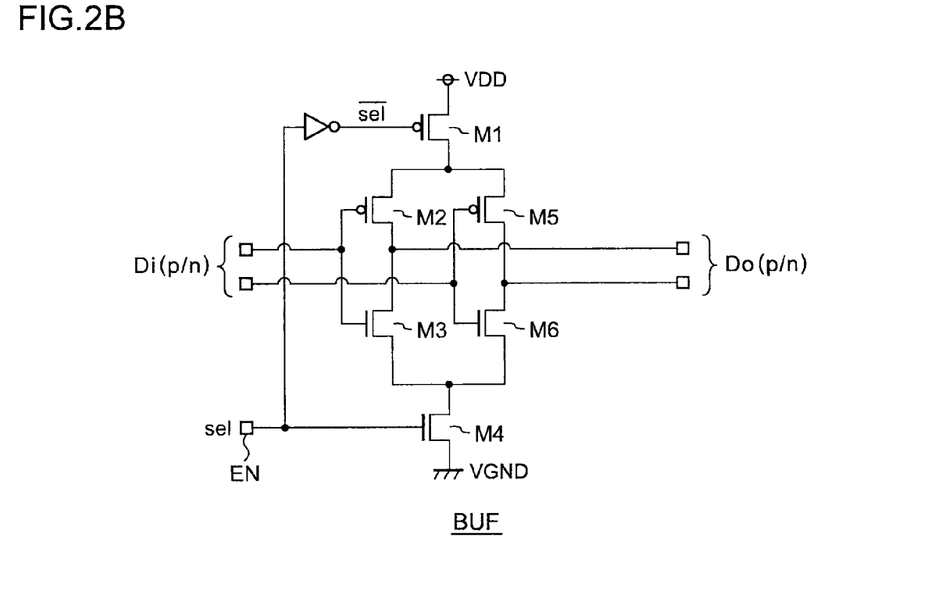

FIGS. 2A and 2B are circuit diagrams each showing a configuration of a multiplexer 100 according to a first embodiment. Referring to FIG. 1A, the multiplexer 100 receives differential signals A through E via multiple channels, selects one of these differential signals that corresponds to a 5-bit control signal sel[4:0], and outputs the differential signal thus selected via an output port Po. The control signal sel[4:0] is set such that one bit thereof is selectively asserted (set to high level), and the other bits are negated (set to low level). For example, when the control signal sel[4] (most significant bit) is asserted, the channel A is selected, and when the control signal sel[0] (least significant bit) is asserted, the channel E is selected. It should be noted that the signal format of the control signal sel[4:0] is not restricted in particular.

The multiplexer 100 includes multiple differential input ports $Pi_1$ through $Pi_5$, an output port Po, and multiple buffers $BUF_1$ through $BUF_5$. The number of input channels is not restricted to 5, and may be set to a desired number.

Multiple differential signals A through E are input to the multiple differential input ports $Pi_1$ through $Pi_5$.

The multiple buffers BUF1 through BUF5 are provided to the multiple differential input ports $Pi_1$ through $Pi_5$, respectively. Each buffer $BUF_i$ includes a differential input terminal Di connected to the corresponding differential input port $Pi_i$, a differential output terminal Do connected to the output port Po, and an enable terminal EN. As an input signal, each buffer $BUF_i$ receives, via the enable terminal EN, the corresponding control signal sel[i−1], and is configured to be capable of switching the state thereof between an enable state and a disable state.

In the enable state, the buffer $BUF_i$ outputs a differential signal that corresponds to the differential signal input to the differential input terminal Di thereof. In the disable state, the current consumed by the internal circuit of the buffer $BUF_i$ becomes substantially zero, and the differential output terminal Do thereof is set to the high-impedance state.

FIG. 2B shows a preferable configuration of the buffer BUF. The buffer BUF includes a differential terminal Di(p/n), a differential output terminal Do(p/n), a first fixed voltage terminal (power supply terminal VDD), a second fixed voltage terminal (ground terminal VGND), and a first transistor M1 through a sixth transistor M6.

The first transistor M1 through the fourth transistor M4 are sequentially arranged in series between the power supply terminal VDD and the ground terminal VGND. The first transistor M1 and the second transistor M2 are each configured as a P-channel MOSFET, and the third transistor M3 and the fourth transistor M4 are each configured as an N-channel MOSFET. The fifth transistor M5 and the sixth transistor M6 are sequentially arranged in series so as to form a path in parallel with a path that includes the second transistor M2 and the third transistor M3. The fifth transistor M5 is configured as a P-channel MOSFET, and the sixth transistor M6 is configured as an N-channel MOSFET.

The gates of the second transistor M2 and the third transistor M3 are connected to one side of the differential input terminal Di. The gates of the fifth transistor M5 and the sixth transistor M6 are connected to the other side of the differential input terminal Di. The drains of the second transistor M2 and the third transistor M3 are connected to one side of the differential output terminal Do. The drains of the fifth transistor M5 and the sixth transistor M6 are connected to the other side of the differential output terminal Do.

An inversion signal #sel (in the drawings, logical inversion is represented by a bar) of the corresponding control signal sel is input to the gate of the first transistor M1, and the control signal sel is input to the gate of the fourth transistor M4.

When the control signal sel input to the enable terminal EN is high level, the buffer BUF enters the enable state. When the control signal sel is low level, the first transistor M1 and the fourth transistor M4 are turned off, and accordingly, the current path is cut off. In this state, the output port is set to the high-impedance state, and the consumed current becomes substantially zero.

The above is the configuration of the multiplexer 100. Next, description will be made regarding the operation thereof. For example, when there is a desire to select the second channel, i.e., channel B, the corresponding signal sel[1] is asserted, and the other signals, i.e., sel[0] and sel[2] through sel[4], are negated. In this stage, the buffer $BUF_2$ enters the enable state, and the other buffers $BUF_1$ and $BUF_3$ through $BUF_5$ each enter the disable state. In this state, the multiplexer 100 outputs, via the output port Po, a differential signal output from the channel B.

The above is the operation of the multiplexer 100.

With such a multiplexer 100, current flows through only one buffer $BUF_2$ selected from among the multiple buffers $BUF_1$ through $BUF_5$, and the current consumed by the other buffers BUF becomes substantially zero. Thus, such an arrangement reduces current consumption as compared to the multiplexer shown in FIG. 1.

The number of buffers required by the multiplexer 100 shown in FIG. 2 matches the number of differential signals (number of channels). Thus, such an arrangement provides a reduced circuit area as compared to an arrangement in which the selectors are arranged in tournament form as shown in FIG. 1A.

With the multiplexer shown in FIG. 1, the number of stages in the tournament increases as the number of differential signals (channels) increases. Accordingly, the propagation delay applied to each differential signal also increases as the number of differential signals (channels) thus increases. In contrast, with the multiplexer 100 shown in FIG. 2, the propagation delay applied to each differential signal is maintained at a constant level regardless of the number of channels. Thus, such an arrangement also provides another advantage of allowing circuit design to be easily performed.

Second Embodiment

Figure 3:
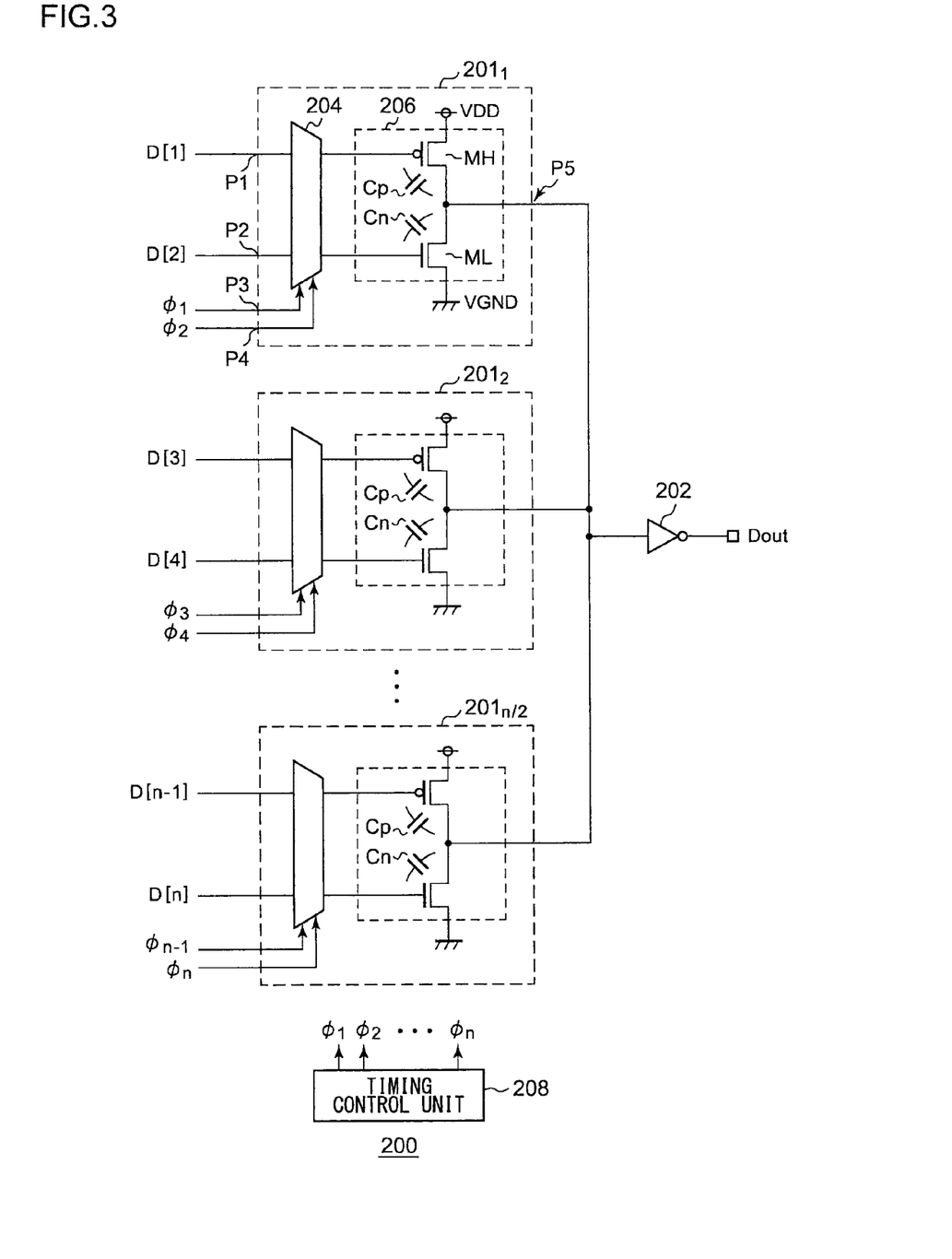
FIG. 3 is a circuit diagram which shows a configuration of a parallel/serial converter (serializer) according to a second embodiment.

FIG. 3 is a circuit diagram which shows a configuration of a parallel/serial converter (serializer) 200 according to a second embodiment. The parallel/serial converter 200 receives n-bit parallel data D[n:1], and converts the parallel data thus received into serial data Dout.

The parallel/serial converter 200 includes multiple two-to-one selectors $201_1$ through $201_{n/2}$, an output buffer (inverter) 202, and a timing control unit 208.

The multiple two-to-one selectors $201_1$ through $201_{n/2}$ are respectively provided to pairs of adjacent two bits of the parallel data. Specifically, the two-to-one selector $201_{i/2}$ is provided to a pair of adjacent bits D[i−1] and D[i].

The output buffer 202 receives the output signals output from the multiple two-to-one selectors $201_1$ through $201_{n/2}$, and outputs serial data Dout. The timing control unit 208 sequentially asserts (sets to high level) the timing control signals $\phi_1$ through $\phi_n$ in synchronization with the serial/parallel conversion operation.

All the two-to-one selectors 201 each have the same configuration. The i-th two-to-one selector $201_i$ includes: a first input terminal P1 configured to receive one bit of the corresponding two bits, i.e., D[2×i−1]; a second input terminal P2 configured to receive the other bit of the corresponding two bits, i.e., D[2×i], and timing control terminals P3 and P4 configured to receive, as input signals, a two-bit timing control signal $\phi_{2×i−1}$ and $\phi_{2×i}$. When the first bit of the control signal, i.e., $\phi_{2×i−1}$, is asserted, the two-to-one selector $201_i$ outputs a signal that corresponds to the signal D[2×i−1] input via the first input terminal P1. When the second bit of the control signal, i.e., $\phi_{2×i}$, is asserted, the two-to-one selector $201_i$ outputs a signal that corresponds to the signal D[2×i] input via the second input terminal P2. When the first bit $\phi_{2×i−1}$ and the second bit $\phi_{2×i}$ of the control signal are both negated, the output is set to the high-impedance state.

More specifically, the two-to-one selector $201_i$ includes a logical gate 204 and a buffer (inverter) 206. The buffer 206 includes a high-side transistor MH and a low-side transistor ML. The drains of the high-side transistor MH and the low-side transistor ML are connected to the output terminal P5.

When the first bit $\phi_{2×i−1}$ of the control signal is asserted, the logical gate 204 outputs, to the transistors MH and ML included in the buffer 206, the gate signal having a level that corresponds to the signal D[2×i−1] input to the first input terminal P1.

When the second bit $\phi_{2×i}$ of the control signal is asserted, the logical gate 204 outputs, to the transistors MH and ML included in the buffer 206, the gate signal having a level that corresponds to the signal D[2×i] input to the second input terminal P2.

When the first bit $\phi_{2×i−1}$ and the second bit $\phi_{2×i}$ are both negated, the logical gate 204 turns off both the transistors MH and ML of the buffer 206, thereby setting the output of the buffer 206 to the high-impedance state.

Figure 4A:
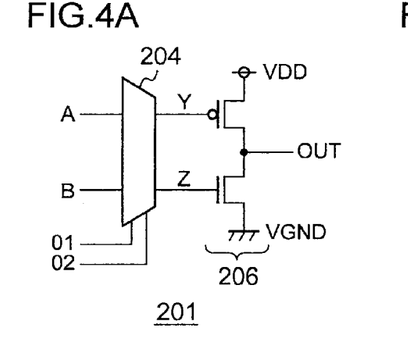
FIGS. 4A through 4E are circuit diagrams each showing a configuration of a two-to-one selector, a truth table thereof, and a time chart thereof.
Figure 4B:
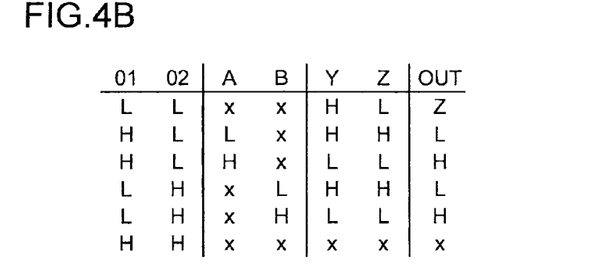
Figures 4C, 4D:
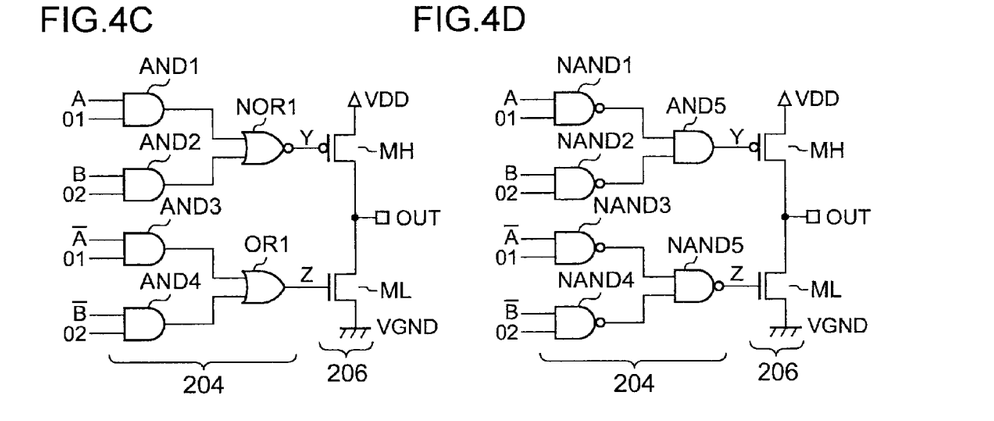
Figure 4E:
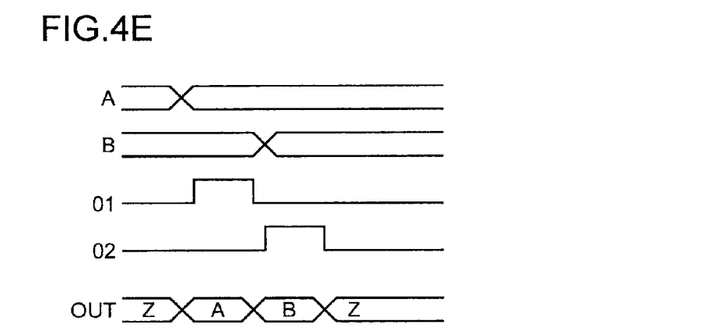

FIGS. 4A through 4E are circuit diagrams each showing the configuration of the two-to-one selector 201, a truth table thereof, and a time chart thereof. FIG. 4A shows a circuit symbol of the two-to-one selector 201. FIG. 4B shows a truth table, in which "x" represents "redundant (Don't Care)". FIGS. 4C and 4D each show a specific example configuration, and FIG. 4E shows a time chart.

Description will be made regarding the logical gate 204 shown in FIG. 4C. A first AND gate AND1 generates the logical AND of a signal A input via a first input terminal and the first bit 01 of the control signal. A second AND gate AND2 generates the logical AND of a signal B input via a second input terminal and the second bit 02 of the control signal. A third AND gate AND3 generates the logical AND of the inversion signal #A of the signal input via the first input terminal and the first bit 01 of the control signal. A fourth AND gate AND4 generates the logical AND of the inversion signal #B of the signal input via the second input terminal and the second bit 02 of the control signal. A first NOR gate NOR1 generates the logical NOR Y of the output signal of the first AND gate AND1 and the output signal of the second AND gate AND2, and outputs the logical NOR Y thus generated to the gate of a high-side transistor MH. A first OR gate OR1 generates the logical OR Z of the output signal of the third AND gate AND3 and the output signal of the fourth AND gate AND4, and outputs the logical OR Z thus generated to the gate of a low-side transistor ML.

Description will be made regarding a logical gate 204 shown in FIG. 4D. A first NAND gate NAND1 generates the logical NAND of the signal A input to the first input terminal and the first bit 01 of the control signal. A second NAND gate NAND2 generates the logical NAND of the signal B input to the second terminal and the second bit 02 of the control signal. A third NAND gate NAND3 generates the logical NAND of the inversion signal #A of the signal input to the first input terminal and the first bit 01 of the control signal. A fourth NAND gate NAND4 generates the logical NAND of the inversion signal #B of the signal input to the second input terminal and the second bit 02 of the control signal. A fifth AND gate AND5 generates the logical AND Y of the output signal of the first NAND gate NAND1 and the output signal of the second NAND gate NAND2, and outputs the logical AND Y thus generated to the gate of a high-side transistor MH. A fifth NAND gate NAND5 generates the logical NAND Z of the output signal of the third NAND gate NAND3 and the output signal of the fourth NAND gate NAND4, and outputs the logical NAND Z thus generated to the gate of a low-side transistor ML.

The logical gate 204 shown in FIG. 4C and the logical gate shown in FIG. 4D each provide a logical operation according to the truth table shown in FIG. 4B. It should be noted that the configuration of the logical gate 204 is not restricted to such a configuration shown in FIG. 4C or 4D. Rather, any configuration may be made as long as it provides such a logical operation according to the truth table.

The above is the configuration of the parallel/serial converter 200. Next, description will be made regarding the operation thereof.

Figure 5:
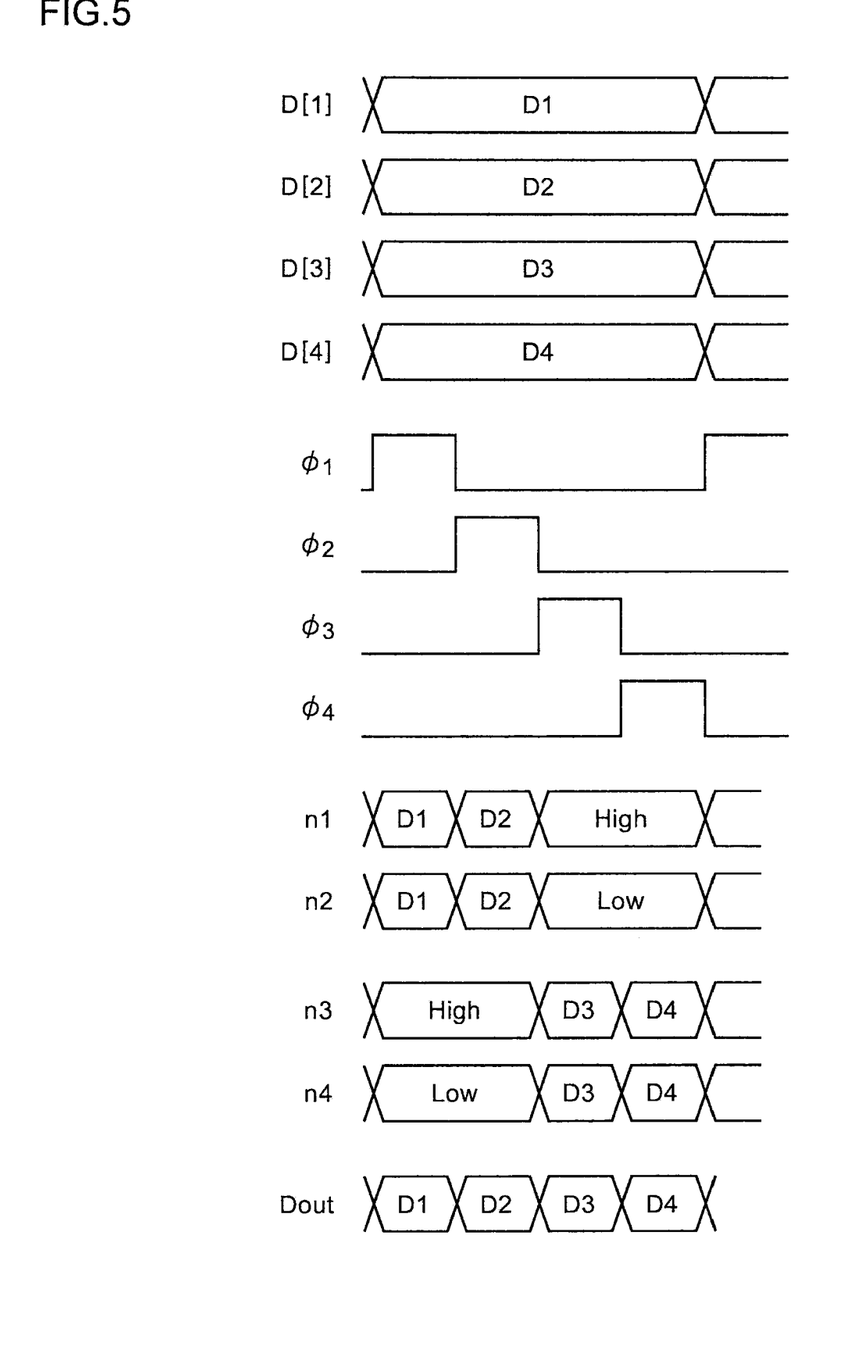
FIG. 5 is a time chart which shows the operation of the parallel/serial converter shown in FIG. 3.

FIG. 5 is a time chart which shows the operation of the parallel/serial converter 200 shown in FIG. 3. The time chart in FIG. 5 shows an arrangement in which n=4. In the drawing, n1 represents the gate voltage of the high-side transistor MH of the first two-to-one selector 201, n2 represents the gate voltage of the low-side transistor ML of the first two-to-one selector 201, n3 represents the gate voltage of the high-side transistor MH of the second two-to-one selector 201, and n4 represents the gate voltage of the low-side transistor ML of the second two-to-one selector 201. With the parallel/serial converter 200 shown in FIG. 3, by sequentially asserting the timing control signals $\phi_1$ through $\phi_n$, such an arrangement is capable of converting parallel data into serial data.

The advantage of the parallel/serial converter 200 shown in FIG. 3 can be clearly understood in comparison with conventional techniques.

Figure 6:
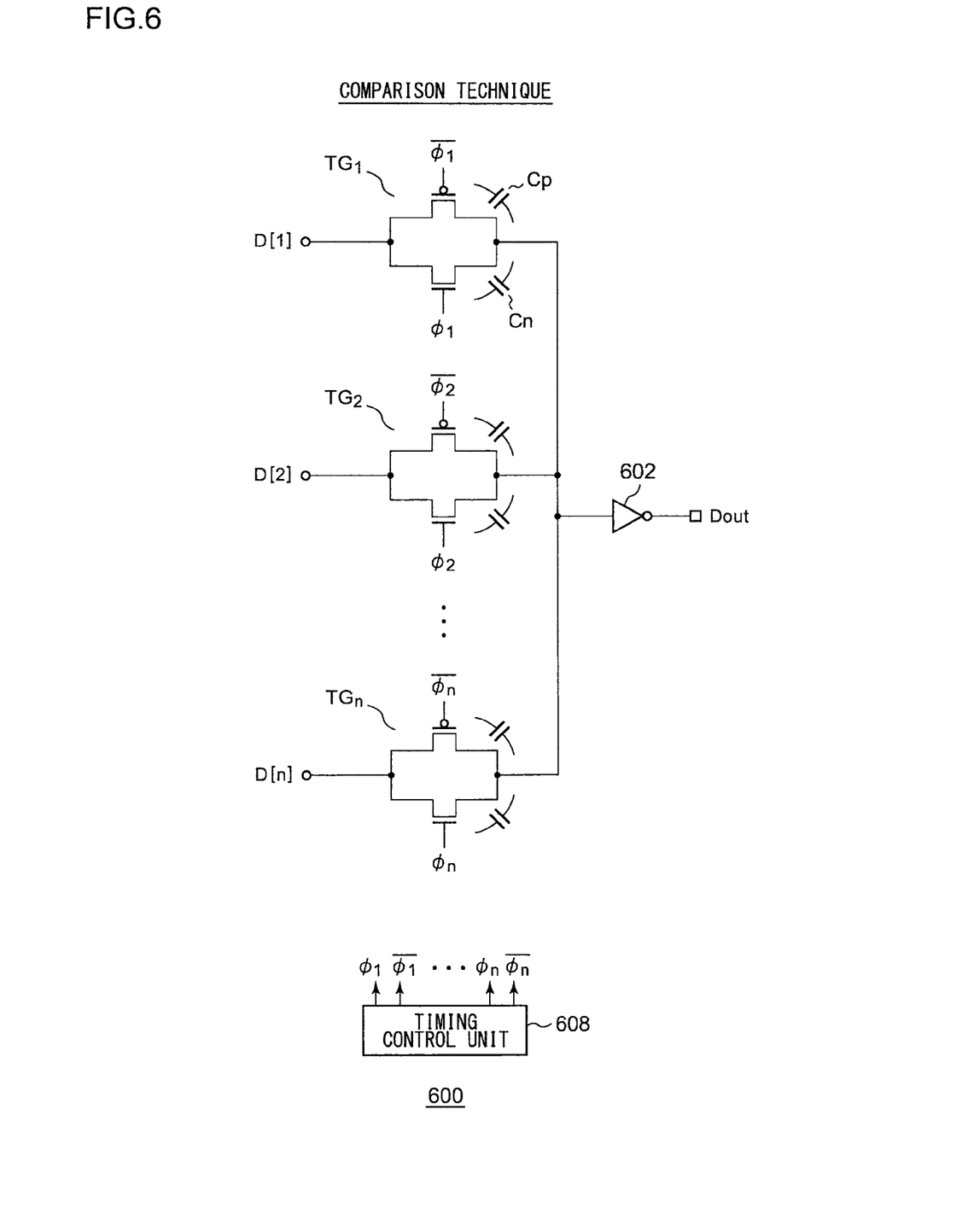
FIG. 6 is a circuit diagram which shows a configuration of a parallel/serial converter according to a comparison technique.

FIG. 6 is a circuit diagram which shows a configuration of a parallel/serial converter 600 according to a conventional technique. The parallel/serial converter 600 includes multiple transfer gates $TG_1$ through $TG_n$ respectively provided to parallel data D[1] through D[n]. The transfer gates $TG_1$ through $TG_n$ are sequentially turned on according to the timing control signals $\phi_1$ through $\phi_n$ generated by the timing control unit 608. An output buffer 602 receives the output signals of the transfer gates $TG_1$ through $TG_n$, and outputs serial data Dout.

Each transfer gate TG has parasitic capacitances Cp and Cn. These parasitic capacitances are the gate-drain capacitances of the P-channel MOSFET and the N-channel MOS- FET that form the transfer gate. This means that a parasitic capacitance (n×Cp+n×Cn) that is proportional to the number of transfer gates is connected to the input terminal of the output buffer 602 in the parallel/serial converter 600 shown in FIG. 6. Such a parasitic capacitance functions as a low-pass filter, which is disadvantageous in high-speed parallel/serial conversion.

Directing attention to the parallel/serial converter 200 shown in FIG. 3, the parasitic capacitance connected to the input terminal of the output buffer 202 is (n/2×Cp+n/2×Cn). That is to say, the parasitic capacitance in the parallel/serial converter 200 is reduced to half of that in the parallel/serial converter 600 shown in FIG. 6. As a result, such an arrangement provides high-speed parallel/serial conversion.

Figure 7:
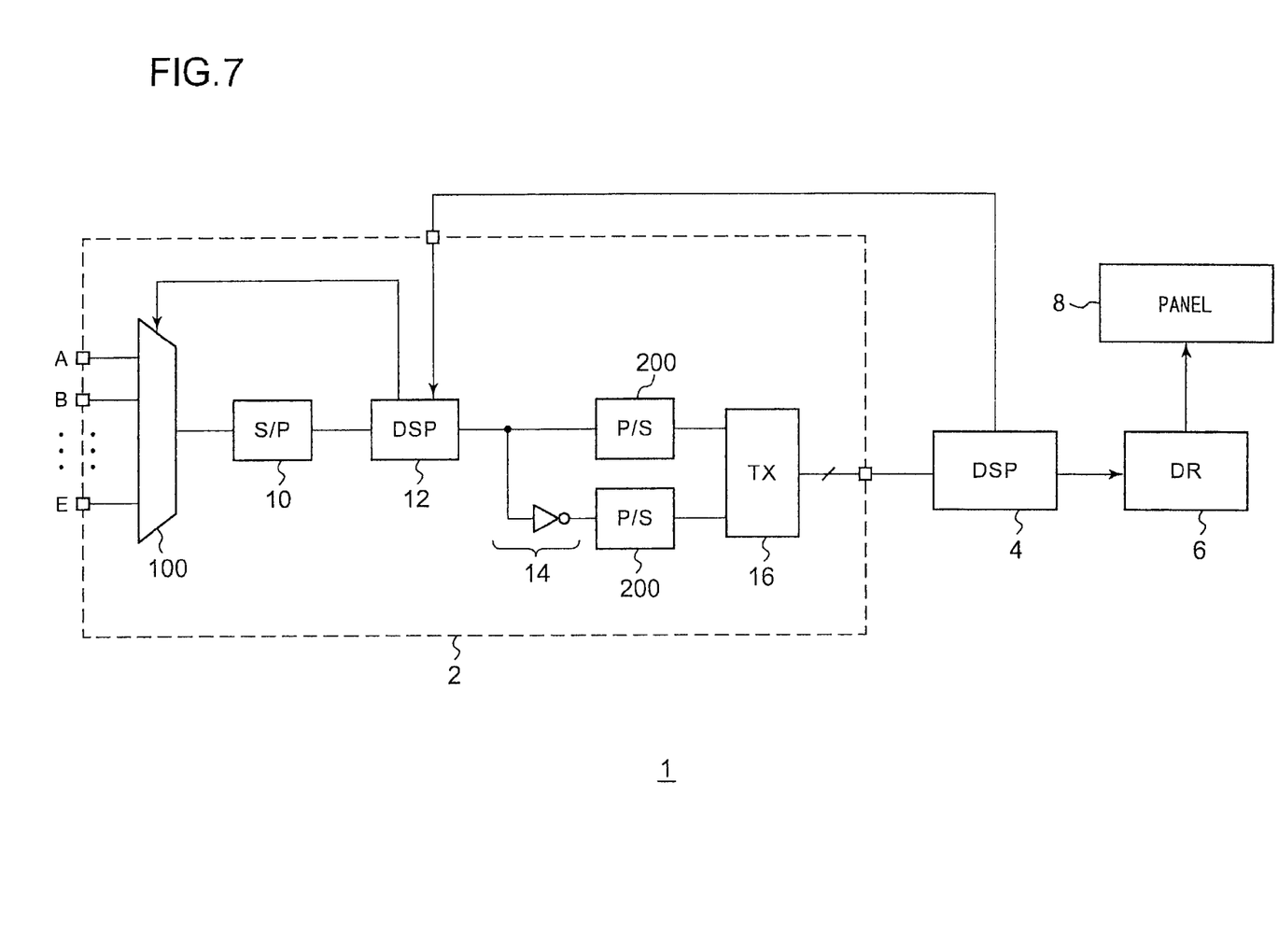
FIG. 7 is a block diagram which shows a configuration of a display apparatus including a multiplexer and a parallel/serial converter.

Next, description will be made regarding a suitable application of the multiplexer 100 according to the first embodiment or the parallel/serial converter 200 according to the second embodiment. FIG. 7 is a block diagram which shows a configuration of a display apparatus including the multiplexer 100 and the parallel/serial converter 200.

A display apparatus 1 includes a signal processing circuit 2, a DSP (Digital Signal Processor) 4, a display driver 6, and a display panel 8.

The signal processing circuit 2 is a unit configured to provide an interface function for interfacing with an external device, and receives image data via an interface such as HDMI or DVI. The signal processing circuit 2 selects image data that corresponds to an instruction from the user from among the image data input via multiple channels A through E, and transmits the image data thus selected to the DSP 4. The DSP 4 performs various kinds of signal processing on the image data thus received, and outputs the image data thus processed to the display driver 6. The display driver 6 drives the display panel 8 according to the image data received from the DSP 4.

The signal processing circuit 2 includes the aforementioned multiplexer 100, a serial/parallel converter 10, a signal processing unit 12, a differential conversion circuit 14, the aforementioned parallel/serial converter 200, and a transmission unit 16.

The multiplexer 100 selects image data that corresponds to a control signal sel[4:0] from among the image data input via the multiple channels. The serial/parallel converter 10 performs serial/parallel conversion of the image data thus selected by the multiplexer 100. The signal processing unit 12 performs predetermined signal processing on the output signals of the serial/parallel converter 10. The kind of signal processing is not restricted in particular. Examples of such signal processing include I/P (interlace/progressive) conversion, resolution conversion, etc. The differential conversion circuit 14 converts the signal processed by the signal processing unit 12 into a differential signal. The parallel/serial converter 200 performs parallel/serial conversion of the differential signal output from the differential conversion unit. The transmission unit 16 transmits the output signal of the parallel/serial converter 200.

Description has been made regarding a suitable application of the multiplexer 100 and the parallel/serial converter 200. With the signal processing circuit 2, by employing the multiplexer 100, such an arrangement provides reduced current consumption, and provides a reduced circuit scale and reduced costs. In addition, by employing the parallel/serial converter 200, such an arrangement provides high-speed signal interfacing.

While the preferred embodiments of the present invention have been described using specific terms, such description is for illustrative purposes only, and it is to be understood that changes and variations may be made without departing from the spirit or scope of the appended claims.

What is claimed is:

1. A multiplexer configured to receive a plurality of differential signals, to select one that corresponds to a control signal, and to output, via an output port, the differential signal thus selected, the multiplexer comprising:
    a plurality of differential input ports each configured to receive a corresponding signal from among the plurality of differential signals; and
    a plurality of buffers respectively provided to the plurality of differential input ports, each comprising a differential input terminal connected to the corresponding differential input port and a differential output terminal connected to the output port, and each configured such that the states thereof are switchable according to the control signal between an enable state in which a differential signal that corresponds to the differential signal input to the differential input terminal is output, and a disable state in which current consumed by the buffer becomes substantially zero and the differential output terminal thereof is set to a high-impedance state,
    wherein each of the plurality of buffers comprises:
    the aforementioned differential input terminal;
    the aforementioned differential output terminal;
    a first fixed voltage terminal;
    a second fixed voltage terminal;
    a first transistor and a second transistor each configured as a P-channel MOSFET (Metal Oxide Semiconductor Field Effect Transistor) and a third transistor and a fourth transistor each configured as an N-channel MOSFET, which are arranged in series between the first fixed voltage terminal and the second fixed voltage terminal; and
    a fifth transistor configured as a P-channel MOSFET and a sixth transistor configured as an N-channel MOSFET, which are sequentially arranged in series so as to form a path in parallel with a path comprising the second and third transistors,
    wherein the gates of the second and third transistors are connected to one side of the differential input terminal,
    and wherein the gates of the fifth and sixth transistors are connected to the other side of the differential input terminal,
    and wherein the drains of the second and third transistors are connected to one side of the differential output terminal,
    and wherein the drains of the fifth and sixth transistors are connected to the other side of the differential output terminal,
    and wherein an inversion signal that is the inversion of the control signal is input to the gate of the first transistor,
    and wherein the control signal is input to the gate of the fourth transistor.

2. A signal processing circuit configured to receive a plurality of image data in the form of differential signals, to select one image data from among the plurality of image data, and to output the image data thus selected, the signal processing circuit comprising:
    a multiplexer configured to receive the plurality of image data, and to select one from among the image data thus received that corresponds to a control signal, and to output, via an output port, the differential signal thus selected;
    a serial/parallel converter configured to perform serial/parallel conversion of the image data output from the multiplexer;

a signal processing unit configured to perform predetermined signal processing on an output signal of the serial/parallel converter;
a differential conversion unit configured to convert the signal processed by the signal processing unit into a differential signal;
a parallel/serial converter configured to perform parallel/serial conversion of the differential signal output from the differential conversion unit; and
a transmission unit configured to transmit an output signal of the parallel/serial converter,
wherein the multiplexer comprises:
a plurality of differential input ports each configured to receive a corresponding signal from among the plurality of differential signals; and
a plurality of buffers respectively provided to the plurality of differential input ports, each comprising a differential input terminal connected to the corresponding differential input port and a differential output terminal connected to the output port, and each configured such that the states thereof are switchable according to the control signal between an enable state in which a differential signal that corresponds to the differential signal input to the differential input terminal is output, and a disable state in which current consumed by the buffer becomes substantially zero and the differential output terminal thereof is set to a high-impedance state.

3. A signal processing circuit configured to receive a plurality of image data in the form of differential signals, to select one image data from among the plurality of image data, and to output the image data thus selected, the signal processing circuit comprising:
multiplexer according to claim 1, configured to receive the plurality of image data, and to select one from among the image data thus received;
a serial/parallel converter configured to perform serial/parallel conversion of the image data output from the multiplexer;
a signal processing unit configured to perform predetermined signal processing on an output signal of the serial/parallel converter;
a differential conversion unit configured to convert the signal processed by the signal processing unit into a differential signal;
a parallel/serial converter configured to perform parallel/serial conversion of the differential signal output from the differential conversion unit; and
a transmission unit configured to transmit an output signal of the parallel/serial converter.

4. A display apparatus comprising a signal processing circuit according to claim 2.

5. A display apparatus comprising a signal processing circuit according to claim 3.

6. A signal processing circuit configured to receive a plurality of image data in the form of differential signals, to select one from among the plurality of image data, and to output the image data thus selected, the signal processing circuit comprising:
a multiplexer configured to receive the plurality of image data, and to select one image data;
a serial/parallel converter configured to perform serial/parallel conversion on the image data output from the multiplexer;
a signal processing unit configured to perform predetermined signal processing on an output signal of the serial/parallel converter;
a differential conversion unit configured to convert the signal processed by the signal processing unit into a differential signal;
a parallel/serial converter configured to perform parallel/serial conversion of the differential signal output from the differential conversion unit; and
a transmission unit configured to transmit an output signal of the parallel/serial converter,
wherein
the parallel/serial converter comprises:
a plurality of two-to-one selectors respectively provided to two-bit pairs of the parallel data; and
an output buffer configured to receive output signals of the plurality of two-to-one selectors,
and wherein each of the two-to-one selectors comprises:
a first input terminal configured to receive one bit of the corresponding two-bit pair;
a second input terminal configured to receive the other bit of the corresponding two-bit pair; and
a control terminal configured to receive, as an input signal, a two-bit control signal,
and wherein, when a first bit of the control signal is asserted, a signal that corresponds to the signal input to the first input terminal is output,
and wherein, when a second bit of the control signal is asserted, a signal that corresponds to the signal input to the second input terminal is output,
and wherein, when the first bit and the second bit of the control signal are negated, the output thereof is set to a high-impedance state.

7. The signal processing circuit according to claim 6, wherein the two-to-one selector comprises:
a first NAND gate configured to generate the logical NAND of a signal input to the first input terminal and the first bit of the control signal;
a second NAND gate configured to generate the logical NAND of a signal input to the second input terminal and the second bit of the control signal;
a third NAND gate configured to generate the logical NAND of an inversion signal that is the inversion of the signal input to the first input terminal and the first bit of the control signal;
a fourth NAND gate configured to generate the logical NAND of an inversion signal that is the inversion of the signal input to the second input terminal and the second bit of the control signal;
a high-side transistor configured as a P-channel MOSFET and a low-side transistor configured as an N-channel MOSFET, which are sequentially arranged in series between a first fixed voltage terminal and a second fixed voltage terminal;
a fifth AND gate configured to generate the logical AND of an output signal of the first NAND gate and an output signal of the second NAND gate, and to output the logical AND thus generated to the gate of the high-side transistor; and
a fifth NAND gate configured to generate the logical NAND of an output signal of the third NAND gate and an output signal of the fourth NAND gate, and to output the logical NAND thus generated to the gate of the low-side transistor.

8. The signal processing circuit according to claim 6, wherein the two-to-one selector comprises:
a first AND gate configured to generate the logical AND of the signal input to the first input terminal and the first bit of the control signal;

a second AND gate configured to generate the logical AND of a signal input to the second input terminal and the second bit of the control signal;

a third AND gate configured to generate the logical AND of an inversion signal that is the inversion of the signal input to the first input terminal and the first bit of the control signal;

a fourth AND gate configured to generate the logical AND of an inversion signal that is the inversion of the signal input to the second input terminal and the second bit of the control signal;

a high-side transistor configured as a P-channel MOSFET and a low-side transistor configured as an N-channel MOSFET, which are sequentially arranged in series between a first fixed voltage terminal and a second fixed voltage terminal;

a first NOR gate configured to generate the logical NOR of an output signal of the first AND gate and an output signal of the second AND gate, and to output the logical NOR thus generated to the gate of the high-side transistor; and a first OR gate configured to generate the logical OR of an output signal of the third AND gate and an output signal of the fourth AND gate, and to output the logical OR thus generated to the gate of the low-side transistor.

9. A display apparatus comprising a signal processing circuit according to claim 8.

10. A signal processing circuit configured to receive a plurality of image data in the form of differential signals, to select one image data from among the plurality of image data, and to output the image data thus selected, the signal processing circuit comprising:

a multiplexer configured to receive the plurality of image data, and to select one image data;

a serial/parallel converter configured to perform serial/parallel conversion on the image data output from the multiplexer;

a signal processing unit configured to perform predetermined signal processing on an output signal of the serial/parallel converter;

a differential conversion unit configured to convert the signal thus processed by the signal processing unit into a differential signal;

a parallel/serial converter, configured to perform parallel/serial conversion of the differential signal output from the differential conversion unit; and a transmission unit configured to transmit an output signal of the parallel/serial converter, wherein the multiplexer comprises:

a plurality of differential input ports each configured to receive a corresponding signal from among the plurality of differential signals; and a plurality of buffers respectively provided to the plurality of differential input ports, each comprising a differential input terminal connected to the corresponding differential input port and a differential output terminal connected to the output port, and each configured such that the states thereof are switchable according to the control signal between an enable state in which a differential signal that corresponds to the differential signal input to the differential input terminal is output, and a disable state in which current consumed by the buffer becomes substantially zero and the differential output terminal thereof is set to a high-impedance state.

11. A display apparatus comprising a signal processing circuit according to claim 10.

* * * * *